United States Patent
Krywanczyk et al.

(10) Patent No.: US 6,284,151 B1
(45) Date of Patent: Sep. 4, 2001

(54) CHEMICAL MECHANICAL POLISHING SLURRY FOR TUNGSTEN

(75) Inventors: Timothy C. Krywanczyk, Essex Junction, VT (US); Lawrence D. David, Dover, NH (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/997,289

(22) Filed: Dec. 23, 1997

(51) Int. Cl.[7] .................................................. C09K 13/04
(52) U.S. Cl. ..................... 252/79.1; 252/79.2; 252/79.4
(58) Field of Search ................................ 438/691, 692, 438/693, 699; 252/79.1; 156/345

(56) References Cited

U.S. PATENT DOCUMENTS

| | | | |
|---|---|---|---|
| 4,789,648 | 12/1988 | Chow et al. | 437/225 |
| 4,944,836 | 7/1990 | Beyer et al. | 156/645 |
| 5,407,526 | 4/1995 | Danielson et al. | 156/636 |
| 5,476,606 | * 12/1995 | Brancaleoni et al. | 252/79.1 |
| 5,506,182 | * 4/1996 | Yamagishi et al. | 502/66 |
| 5,516,346 | 5/1996 | Cadien et al. | 51/308 |
| 5,527,423 | * 6/1996 | Neville et al. | 156/636.1 |
| 5,637,185 | * 6/1997 | Murarka et al. | 438/5 |
| 5,770,103 | * 6/1998 | Wang et al. | 252/79.1 |

OTHER PUBLICATIONS

SEMI Technical Programs Present Chemical Mechanical Polishing—Metals Seminar (CMP); Semicon/Southwest 95; Oct. 23, 1995, "Process Optimization of Tungsten CMP" by V. Blaschke, et al.

* cited by examiner

Primary Examiner—Benjamin L. Utech
Assistant Examiner—Lan Vinh

(57) ABSTRACT

A ferric nitrate-alumina based slurry useful for Chemical-Mechanical-Polishing of tungsten metallurgy on semiconductor substrates in which the suspension and stability of abrasive material in the slurry is essentially stable. The slurry formulation is balanced to provide low residue of foreign material after polishing and due to its reduced ferric nitrate concentration will be less corrosive than prior art slurries. The recipe for the slurry includes 375 ml of a 9% wt alumina suspension, about 200 grams ferric nonahydrate, water to dilute to about 4.5 liters and enough 70% wt nitric acid to adjust the pH of the slurry to about 1.0 to 1.5.

5 Claims, No Drawings

CHEMICAL MECHANICAL POLISHING SLURRY FOR TUNGSTEN

BACKGROUND OF THE INVENTION

1. Field of the Invention

This invention relates to the planarization of semiconductor devices by Chemical-Mechanical-Polishing (CMP) techniques and, more particularly, to the formulation of polishing slurries for metals including tungsten wherein the slurry has a prolonged stability against settling of abrasive material and which is less corrosive to equipment.

2. Description of the Prior Art

Chemical-Mechanical-Polishing techniques are used in the semiconductor processing industry to enable interconnect metallurgy of the highest density to be fabricated. Based on the teachings in U.S. Pat. No. 4,789,648 to Chow et al. and U.S. Pat. No. 4,944,836 to Beyer et al., CMP has enabled the continued shrinking of semiconductor device dimensions by the practical and manufacturable introduction of planarization of both metals and interlevel dielectrics to semiconductor processing. By maintaining the surface of a semiconductor device as flat as possible, the rendering of optical images of ever smaller size continues to be possible.

CMP generally is based on the principles that most hard materials are reactive with oxidants to form oxides and other softer compounds which, in turn, can be polished away. If the process of reacting and polishing can be controlled sufficiently, semiconductor metallurgy will continue to lead the path to miniaturization.

It is known to planarize tungsten metallurgy by polishing with an aqueous slurry comprising alumina in ferric nitrate. See "PROCESS OPTIMIZATION OF TUNGSTEN CMP," V. Blaschke and K. Holland, Chemical Mechanical Polishing—Metals Seminar (CMP), SEMICON/Southwest '95; Austin, Tex. Oct. 23, 1995. This slurry, when used in an IPEC-Westech Systems wafer polisher at a feedrate of about 125 ml per minute, has the capability of polishing tungsten at 3,000 Angstroms per minute. The slurry, however, has the following disadvantages:

1. The alumina colloidal suspension is unstable and the ferric nitrate solution must be agitated constantly to keep the suspension dispersed in the solution. If left alone, the suspension collapses within a few hours rendering it impossible to formulate batches of slurry in advance. The settling of the alumina particles indicates that the particles are not well dispersed at all, a condition which could easily lead to scratching and cause other polishing irregularities since the slurry actually contains particulates and aggomerates large enough to settle out of suspension. This also can cause Foreign Material (FM) problems and loss of product yield.

2. The polishing slurry leaves rust residue on items throughout the CMP tool area. Whenever some slurry is spilled or sprayed, orange rust is left behind when the slurry dries. The stains are an indication that the ferric ion is prone to polymerizing to oxo-bridged species, leading to ferric-bearing oxide residues. These residues are a source of FM. The polymerization can also account for agglomeration of the alumina, as the polymerized ferric species likely promotes adhesion of alumina particles to each other. This condition often causes tools to be shut down for cleaning and removal of slurry cakes by the use of a hammer.

3. The heterogenity of the slurry also prohibits the bulk feeding of the slurry to the tools. Because the particulates in the slurry have a tendency to settle out, the particulates will precipitate out within any delivery system clogging tubing and valves.

4. The tendency of the ferric components to form rust residue causes corrosion wherever the slurry lands and dries on stainless steel parts of the polishing tools. This is a cause of FM problems and eventually destroys polisher components.

Other ferric-based salts have been proposed and include ferricyanides as oxidizers, combined with an acetate buffer and acetic acid using a silica abrasive as described in U.S. Pat. No. 5,407,526 to Danielson et al. and U.S. Pat. No. 5,516,346 to Cadien etal.

U.S. Pat. No. 5,527,423 to Neville et al. describes a polishing slurry for polishing metals. The slurry includes ferric nitrate nonahydrate and deionized water in which a special fumed alumina or silica is used to provide stability of particles in suspension. The disclosure also suggests other additives and stabilizers which may be added immediately prior to use. The differences in polish rates obtained are attributed to the high surface area fumed silica or alumina of the invention and the resulting slurry suitable for most metals.

SUMMARY OF THE INVENTION

Thus, an improved slurry must avoid all of the above problems and also be capable of polishing at a rate of about 3,000 Angstroms per minute and have a selectivity to interlevel dielectrics, particularly silicon oxides of at least 10:1.

It is therefore an object of the invention to provide an effective slurry for polishing tungsten that maintains a high polish rate while reducing the quantity of chemicals used.

It is another object of the invention to provide a polishing slurry in which the abrasive particulates are truly distributed in the solution and do not separate out of solution.

It is yet another object of the invention to provide a polishing slurry in which metal contaminates are maintained in solution and do not precipitate out of solution.

Another object of the invention is to provide more efficient polishing slurries in which scratching is reduced because particles do not agglomerate.

These and other objects of the invention are achieved by providing a slurry for CMP polishing comprising an alumina abrasive, an oxidizer having an anion which forms soluble salts with metals having atomic numbers less than 83, water and an acid having the same anion as the oxidizer. More specifically, a CMP polishing slurry comprising ferric nonahydrate, an alumina slurry, nitric acid and water. More specifically the slurry comprises 175 to 225 grams of ferric nonahydrate added to about 340 to 410 ml 9% by weight alumina slurry diluted to about 4.1 to 4.8 liters with deionized water and pH balanced to a range of 1.0 to 1.5.

These and other objects of the invention will become more apparent when viewed in the light of the following description of the preferred embodiment.

DESCRIPTION OF THE PREFERRED EMBODIMENT

CMP technology has been practiced for many years and is based on the principle that relatively hard materials can be polished, or more properly planarized, by a combination of a chemical conversion of the material to a softer compound and the physical removal of that softer material with an abrasive process. The basis of CMP of many metals is the surface oxidation of the metal followed by the abrasive removal of the oxide. In the case of tungsten the preferred oxidant is the ferric ion and the following reaction is believed to occur.

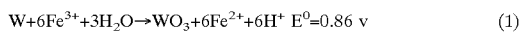

$$W+6Fe^{3+}+3H_2O \rightarrow WO_3+6Fe^{2+}+6H^+ \quad E^0=0.86\ v \quad (1)$$

The ferrous ion is oxidized back to ferric by the nitrate ion by the following reaction.

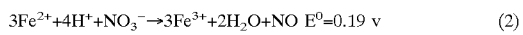

$$3Fe^{2+}+4H^++NO_3^- \rightarrow 3Fe^{3+}+2H_2O+NO \quad E^0=0.19\ v \quad (2)$$

thus sustaining the reaction rate.

The oxide, $WO_3$, is then removed by the alumina ($Al_2O_3$) abrasive exposing additional unoxidized tungsten which undergoes more oxidation, etc. until the process is terminated.

The problem of providing a true dispersion of a solid oxide in aqueous suspension is best considered by knowing the electrical charge on the oxide particles. All oxides suspended in water exhibit a characteristic pH. Oxide particulates will cause a solution to exhibit a pH at which their surfaces will exhibit no net charge, the iso-electric point (IEP). In order for particles of an oxide to repel each other in suspension, the pH must be set either several unit more basic than the IEP (imparting negative charge) or several units more acidic (imparting positive charge). When the pH is thus set, the like-charged particles mutually repel and the suspension remains dispersed. If the ionic strength is raised too high, the surface charge around the particles is disrupted and the suspension collapses.

In the case of alumina, the iso-electric point and the proper pH at which to disperse it varies widely depending on the provenance of the material and its phase. IEPs of between 1.0 and 2.0 have been reported. Currently used alumina supplied as slurry for CMP exhibits a pH of 7.5±0.5 when about 9 weight percent $Al_2O_3$ in water. Alumina received from vendors which exhibit a pH of less than 7.0 in suspension cannot be dispersed in water alone.

The addition of ferric nitrate to the suspension swings the pH down to the vicinity of about 1.5 and the suspension turns a yellow-brown color. The chemistry of the ferric ion in aqueous solution accounts for this result. Ferric ions in aqueous solution actually forms a moderate strength acid:

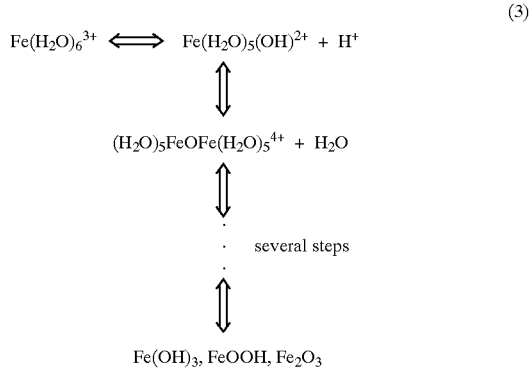

$$Fe(H_2O)_6^{3+} \rightleftharpoons Fe(H_2O)_5(OH)^{2+} + H^+ \quad (3)$$

$$\Updownarrow$$

$$(H_2O)_5FeOFe(H_2O)_5^{4+} + H_2O$$

$$\Updownarrow$$

· several steps $$\Updownarrow$$

$$Fe(OH)_3, FeOOH, Fe_2O_3$$

Ferric ion thus tends to dissociate protons and to polymerize. The polymer species imparts the characteristic brown color to solutions containing ferric ions. The $Fe(H_2O)_6^{3+}$ ion is actually pale violet.

These polymers also can bridge alumina particles inducing agglomeration. This phenomenon is exactly what occurs in the slurry mix if allowed to sit for any period of time. It therefore becomes necessary to constantly agitate the ferric nitrate/alumina slurry with a nitrogen gas bubbler. Because of the tendency to agglomerate, the slurry cannot be pumped any great distance from the polishing tool.

It has been found that:

1. The amount of ferric nitrate in the previous slurry was excessive and resulted in making the alumina more difficult to disperse. We prefer about 200 grams of ferric nitrate nonahydrate ($Fe(NO_3)_3 \cdot 9H_2O$) per liter of aqueous feed solution.

2. Nitric acid ($HNO_3$) is added to the slurry to shift the equilibrium of the oxo-bridged ferric species back toward the $Fe(H_2O)_6^{3+}$ ion. This combination yields a suspension of far superior stability. The breakup of the ferric ion polymers suppresses agglomeration of the alumina particles. The amount of nitric acid found to be optimum was about 25 ml of 70% nitric acid per liter of $Fe(NO_3)_3$ feedstock solution or to 4.5 liters of slurry. Significantly higher amounts of nitric acid, say 100 ml, will cause the suspension to collapse. The color of the acidified, ferric nitrate/alumina is white and upon drying does not precipitate out a rust-colored stain.

The slurry of the invention polishes tungsten with equal efficiency to that of the previous slurry at about 3,000 Angstroms per minute. High selectivity for tungsten over interlevel dielectric oxide is also maintained.

The improvement of the slurry of the invention over the previously used slurry is evident from the following comparison. When a previously formulated and the slurry of the instant invention were allowed to stand, it was observed that the old slurry began to settle almost immediately and would be completely settled, the solution clear, after about four hours. The slurry of the invention was not observed to settle after a 24 hours except for some fines which were observed on the bottom of the sample.

The superior stability of the slurry offers the opportunity of providing a bulk feed system for delivering slurry to polishing tools. Previously, slurry had to be mixed just prior to use at the polishing tool.

The choice of nitric acid for the acidification step is not trivial to adjust the pH to the required level to prevent agglomeration. Nitric acid places additional nitrate anion in the slurry. This is the same anion already in the slurry as the oxidizer, ferric nitrate. An additional advantage is gained as all metal nitrates, where the metal has an Atomic number less than 83, are soluble and the addition of nitric acid cannot cause the formation of any non-soluble metal nitrate to precipitate out of solution. Other ferric salts and conjugate acids are not as forgiving. For example, ferric sulfate or ferric ammonium sulfate, with sulfuric acid, lacks the nitrate reoxidation feature (Equation 2) of the slurry of the invention and also raises the risk that metal sulfates, such as magnesium and calcium, will precipitate out of solution.

The reduction in the amount of ferric nitrate used in a previous slurry also has the additional benefit of providing a like reduction in the cost of chemicals used for slurry. In a large wafer fab upwards of $250,000 a year might be saved.

In experiments to identify the limits of the slurry of the invention, it was found that other nitrate salts and even nitric acid were not adequate as the oxidation agent. At quantities below 200 g per liter, the polishing rate of tungsten falls off and above 200 g, the alumina becomes more and more difficult to disperse. The process window found to be preferred is 200·±25 g ferric nitrate nonahydride per liter of water.

The addition of nitric acid was originally implemented to adjust the pH down tp the 1.0 to 1.5 range, comparable to previous experience. The low pH ensures that the alumina particles all carry a positive charge. We have found that about 25 ml of 70% nitric acid per 4.5 liters of slurry is sufficient to maintain this dispersion and to shift the equilibrium of equation 3 back to the left. Higher nitrate additives were found to cause much more rapid slurry collapse. This was especially true at 100 ml per 4.5 liters of slurry.

The following examples were performed in order to determine the bounds of the invention.

EXAMPLE 1

To demonstrate the need for ferric ion in the slurry, a feed solution of 259 grams of potassium nitrate in one liter of water was mixed with 375 ml of 9%wt alumina in water. The final mixture was diluted with Deionized (DI) water to 4.5 liters. Although the slurry contained the same nitrate concentration as a previous slurry, it failed to polish tungsten after three minutes on a IPEC-Westech Systems polisher.

EXAMPLE 2

The pH of the slurry recipe of Example 1 was adjusted to a pH of 1.5 by the addition of 65 ml of 70% nitric acid. The resulting slurry still failed to polish tungsten on monitor wafers. It was noted that the alumina stayed suspended in the slurry.

EXAMPLE 3

A slurry was prepared by dissolving 258 grams of potassium nitrate in 4.0 liters of water followed by the addition of 375 ml of 9%wt alumina in water and 46 grams of ferric nitrate nonahydrate and 65 ml of 70% nitric acid. The slurry was adjusted to 4.5 liters by the addition if DI water. The orange-brown color of the solution turned to white when the nitric acid was added.

The slurry was fed at 100–125 ml per minute to a IPEC-Westech Systems polisher. The rate of removal of tungsten was about 1,000 Angstroms per minute or about one third the desired rate. This slurry, in contrast with prior art slurries, stayed in suspension indefinitely and after several hours of use, no coating was observed on the bottom of the source container.

EXAMPLE 4

A slurry composed of 258 grams of potassium nitrate was dissolved in one liter of water, 100 grams of ferric nitrate nonahydrate was added along with 375 grams of 9% wt alumina slurry. When 100 ml of 70% nitric acid was added, the suspension turned from orange-brown to white. The alumina remained suspended for an extended period of time. The final slurry was diluted to 4.5 liters with DI water. When monitor wafers were polished with this slurry, the polish rate of tungsten was about 1,500 Angstroms per minute, about half the rate needed.

The results of Examples 2, 3, and 4 led to the conclusion that the nitric acid was the key to achieving a true suspension of alumina.

EXAMPLE 5

A slurry comprising 400 grams of ferric nitrate nonahydrate was added to 375 ml of 9% wt. alumina slurry. This was diluted to 4.5 liters with DI water. To this 100 ml of 70% nitric acid was added. The last step produced the above referenced change in color from orange-brown to white. When monitor wafers were polished, a rate of about 2,350 Angstroms per minute was observed. This was reasonable close to the desired 3,000 Angstroms per minute.

The results demonstrated that the additions of nitric acid did not significantly effect the polishing rate previously achieved.

EXAMPLE 6

Confirmation of the conclusions reached for Example 5 was achieved by adding 46 grams of ferric nitrate nonahydrate to one liter of water to which 375 ml of 9% wt. alumina slurry was added. The final volume was diluted to 4.5 liters with DI water and 100 ml of 70% nitric acid was added. This slurry achieved a polish rate of about 1,000 Angstroms per minute, the same as Example 3. Thus, it was concluded that the potassium nitrate had no effect on the polish rate in the presence of ferric nitrate in the slurry. The presence of the nitric acid does not degrade the polish performance, although it did effect the dispersion of the alumina.

EXAMPLE 7

A. A slurry comprising 400 grams of ferric nitrate non-ahydrate was added to 375 ml of 9% wt. Alumina slurry. This was diluted to 4.5 liters with DI water. Polish rates of between 2,210 and 3,860 Angstroms per minute were achieved. The slurry was subject to severe settling of alumina.

B. The slurry recipe of Example 7A was modified by adding only 200 grams of ferric nitrate nonahydrate. Polish rates of 2,000 to 3,800 Angstroms per minute were achieved.

C. The slurry recipe of Example 7B was modified by adding 130 grams of potassium nitrate per 4.5 liters of slurry. Polishing rates of between 2,000 and 4,000 Angstroms was achieved. The results show that the potassium nitrate had no effect on the polishing.

EXAMPLE 8

A. Example 4 was repeated without the potassium nitrate. The results were a white stable solution providing a polishing rate of about 1,500 Angstroms per minute.

B. The slurry recipe of Example 8A was modified to include 50 ml of nitric acid (100 g Ferric nitride), 375 ml alumina slurry, 50 ml of nitric acid diluted to 4.5 liters). The polish rate remained at about 1,500 Angstroms per minute and the slurry stayed in suspension better than Example 8A.

EXAMPLE 9

To evaluate the formula limits for ferric nitrate content, two experiments were run.

A. The slurry recipe included 175 grams for ferric nitrate, 375 ml alumina slurry, 25 ml nitric acid diluted to 4.5 liters. Polish rates were about 2,400 Angstroms per minute.

B. The slurry recipe was modified to include 600 grams of ferric nitrate, 375 ml alumina slurry, no acid, diluted to 4.5 liters. Polish rates of between 2,800 and 3400 were achieved. The slurry settled faster than that of Example 7A.

These experiments show that lowering the ferric nitrate nonahydride reduces the polish rate and increasing the ferric nitrate lowers the stability of the slurry.

EXAMPLE 10

A series of slurries was prepared with various amounts of nitric acid and ferric nitrate. All had 375 ml of alumina slurry with the final volume 4.5 liters.

| Ferric nitrate · 9H$_2$O | HNO$_3$ (70%) | Settling characteristics |
| --- | --- | --- |
| 200 g | 100 ml | Alumina settles out in 30 minutes |
| 400 g | none | Alumina settles out in 30 minutes |
| 600 g | 100 ml | Alumina settles out in 30 minutes |
| 200 g | 25 ml | No settling after 4 hours, some on bottom at 18 hours |
| 200 g | 10 ml | Alumina settles some, faster than 25 ml |

Thus, the preferred formulation in 4.5 liters of slurry is 200 grams ferric nitrate Nonahydrate and 25 ml of nitric acid. Higher nitrate additions only cause the slurry to precipitate faster.

EXAMPLE 11

To test the preferred slurry's ability to selectively stop on oxide when polishing tungsten, oxide monitors were evaluated.

A. The original slurry (of Example 7A) removed about 40 Angstroms of oxide per minute.

B. The 200 g ferric nitrate, 25 ml nitric acid slurry removed oxide at about 40 Angstroms per minute.

C. A slurry with 200 g ferric nitrate, 25 ml acid and 375 ml of 9% wt alumina was also found to polish oxide at about 40 Angstroms per minute.

Thus, the ability of the preferred formulation to stop on oxide is identical to that of the previous slurry.

While the invention has been described in terms of limited embodiments, it will be apparent to those skilled in the art that various modifications may be made in the details of the invention without straying from the spirit and claims of the invention.

What is claimed is:

1. The polishing slurry for CMP of metals consisting essentially of:
   an aqueous solution containing a suspension of alumina;
   an oxidizing agent comprising about 175 to 225 grams ferric nitrate hydrate;
   water to provide about 4.5 liters of slurry; and
   a quantity of 70% by weight nitric acid to provide a pH for the slurry of about 1.0 to 1.5.

2. The polishing slurry of claim 1 wherein said aqueous solution of alumina comprises a dispersion of about 9% by weight alumina.

3. The polishing slurry of claim 1 wherein there is provided about 200 grams of ferric nonahydride.

4. The polishing slurry of claim 2 wherein said aqueous solution of alumina is about 375 ml.

5. The polishing slurry for tungsten consisting essentially of:
   about 375 ml stabilized alumina slurry have about 9% by weight alumina;
   about 200 grams of ferric nonahydrate;
   enough deionized water to dilute to about 4.5 liters; and
   about 25 ml 70% by weight nitric acid.

* * * * *